United States Patent
Tseng et al.

(10) Patent No.: US 10,861,549 B1
(45) Date of Patent: Dec. 8, 2020

(54) TERNARY CONTENT ADDRESSABLE MEMORY UNIT CAPABLE OF REDUCING CHARGE SHARING EFFECT

(71) Applicant: UNITED MICROELECTRONICS CORP., Hsin-Chu (TW)

(72) Inventors: Chun-Yen Tseng, Tainan (TW); Ching-Cheng Lung, Tainan (TW); Yu-Tse Kuo, Tainan (TW); Chun-Hsien Huang, Tainan (TW); Chih-Wei Tsai, Hsinchu (TW); Hsin-Chih Yu, Hsinchu County (TW); Shu-Ru Wang, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/503,617

(22) Filed: Jul. 4, 2019

(30) Foreign Application Priority Data

Jun. 12, 2019  (TW) .............................. 108120292 A

(51) Int. Cl.
*G11C 15/00* (2006.01)
*G11C 15/04* (2006.01)
*H01L 27/11* (2006.01)

(52) U.S. Cl.
CPC .......... *G11C 15/04* (2013.01); *H01L 27/1104* (2013.01)

(58) Field of Classification Search
CPC .............................. G11C 15/04; H01L 27/1104

USPC .......................................................... 365/49.1
See application file for complete search history.

(56) References Cited

U.S. PATENT DOCUMENTS

| | | | |
|---|---|---|---|
| 9,502,112 B2 | 11/2016 | Nii | |
| 2014/0177310 A1* | 6/2014 | Vattikonda | G11C 15/04 365/49.17 |
| 2014/0192579 A1* | 7/2014 | Arsovski | G11C 15/04 365/49.11 |
| 2017/0062051 A1* | 3/2017 | Watanabe | G11C 15/04 |

OTHER PUBLICATIONS

Pagiamtzis, "Content-Addressable Memory (CAM) Circuits and Architectures: A Tutorial and Survey", IEEE Journal of Solid-State Circuits, vol. 41, No. 3, Mar. 2006.

* cited by examiner

*Primary Examiner* — Vu A Le
(74) *Attorney, Agent, or Firm* — Winston Hsu

(57) ABSTRACT

A ternary content addressable memory unit includes a first inverter, a second inverter, a third inverter, a fourth inverter, a first transistor, a second transistor, a third transistor, a fourth transistor, a fifth transistor, a sixth transistor, a seventh transistor, and an eighth transistor. The first inverter includes an input terminal, and an output terminal coupled to a first node. The second inverter includes an input terminal coupled to the first node and an output terminal coupled to the input terminal of the first inverter. The third inverter includes an input terminal coupled to a second node and an output terminal. The fourth inverter includes an input terminal coupled to the output terminal of the third inverter and an output terminal coupled to the second node.

16 Claims, 5 Drawing Sheets

TERNARY CONTENT ADDRESSABLE MEMORY UNIT CAPABLE OF REDUCING CHARGE SHARING EFFECT

BACKGROUND OF THE INVENTION

1. Field of the Invention

The present invention is related to a ternary content addressable memory (TCAM) unit, and more particularly to a ternary content addressable memory unit capable of reducing charge sharing effect.

2. Description of the Prior Art

When performing digital data operations, the large amount of data needs to be processed. The stored data of some applications (such as network routers) needs to be updated dynamically, and the stored data cannot be sorted in advance. It is difficult to achieve instant data query. In order to effectively speed up searching large random data, content addressable memory (CAM) is adopted to solve various searching problems. Content addressable memory is like a huge lookup table. It can find the address of the matching keyword based on the input keyword. The architecture of CAM allows the keyword to be searched to be compared with the data stored in the CAM at the same time, and outputs the data address that matches the input keyword, so that the keyword address found by the CAM can be used to find keyword associated information.

In a binary CAM, each bit has two states, 0 or 1, and each bit in a ternary CAM (TCAM) has three states, in addition to 0 and 1, a don't care state, so called ternary, is the third state feature of TCAM that enables both exact match lookups and fuzzy match lookups.

There is a voltage charge sharing problem between the nodes of conventional ternary content addressable memory. If there is charge sharing between the nodes during evaluation phase of the memory operation, it may cause the node voltage to drop to a sufficiently low voltage so the output inverter would have a matching error. Therefore, a solution is required to solve the matching error caused by charge sharing.

SUMMARY OF THE INVENTION

An embodiment provides a ternary content addressable memory (TCAM) unit. The TCAM unit includes a first inverter, a second inverter, a third inverter, a fourth inverter, a first transistor, a second transistor, a third transistor, a fourth transistor, and a fifth transistor, a sixth transistor, a seventh transistor, and an eighth transistor. The first inverter includes an input terminal and an output terminal coupled to a first node. The second inverter includes an input terminal coupled to the first node and an output terminal coupled to the input terminal of the first inverter. The third inverter includes an input terminal coupled to a second node and an output terminal. The fourth inverter includes an input terminal coupled to the output terminal of the third inverter and an output terminal coupled to the second node. The first transistor includes a first terminal coupled to the first node, a second terminal coupled to a first bitline, and a control terminal coupled to a first wordline. The second transistor includes a first terminal coupled to a second bitline, a second terminal coupled to the input terminal of the first inverter and a control terminal coupled to the first wordline. The third transistor includes a first terminal coupled to the second node, a second terminal coupled to the first bitline, and a control terminal coupled to a second wordline. The fourth transistor includes a first terminal coupled to the second bitline, a second terminal coupled to the output terminal of the third inverter and a control terminal coupled to the second wordline. The fifth transistor includes a first terminal coupled to the first wordline, a second terminal, and a control terminal coupled to a second searchline. The sixth transistor includes a first terminal coupled to the second terminal of the fifth transistor, a second terminal coupled to a matchline, and a control terminal coupled to the first node. The seventh transistor includes a first terminal coupled to the matchline, a second terminal, and a control terminal coupled to the second node. The eighth transistor includes a first terminal coupled to the second terminal of the seventh transistor, a second terminal coupled to the other first wordline, and a control terminal coupled to a first searchline. The first wordline is coupled to a reference terminal. The reference terminal is grounded.

An embodiment provides a ternary content addressable memory (TCAM) unit. The TCAM unit includes a first inverter, a second inverter, a third inverter, a fourth inverter, a first transistor, a second transistor, a third transistor, a fourth transistor, and a fifth transistor, a sixth transistor, a seventh transistor, and an eighth transistor. The first inverter includes an input terminal and an output terminal coupled to a first node. The second inverter includes an input terminal coupled to the first node and an output terminal coupled to the input terminal of the first inverter. The third inverter includes an input terminal coupled to a second node and an output terminal. The fourth inverter includes an input terminal coupled to the output terminal of the third inverter and an output terminal coupled to the second node. The first transistor includes a first terminal coupled to the first node, a second terminal coupled to a first bitline, and a control terminal coupled to a first wordline. The second transistor includes a first terminal coupled to a second bitline, a second terminal coupled to the input terminal of the first inverter and a control terminal coupled to the first wordline. The third transistor includes a first terminal coupled to the second node, a second terminal coupled to the first bitline, and a control terminal coupled to a second wordline. The fourth transistor includes a first terminal coupled to the second bitline, a second terminal coupled to the output terminal of the third inverter and a control terminal coupled to the second wordline. The fifth transistor includes a first terminal coupled to the first wordline, a second terminal, and a control terminal coupled to a second searchline. The sixth transistor includes a first terminal coupled to the second terminal of the fifth transistor, a second terminal coupled to a matchline, and a control terminal coupled to the first node. The seventh transistor includes a first terminal coupled to the matchline, a second terminal, and a control terminal coupled to the second node. The eighth transistor includes a first terminal coupled to the second terminal of the seventh transistor, a second terminal coupled to the other first wordline, and a control terminal coupled to a first searchline. The first wordline is coupled to a reference terminal. The reference terminal is floating.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
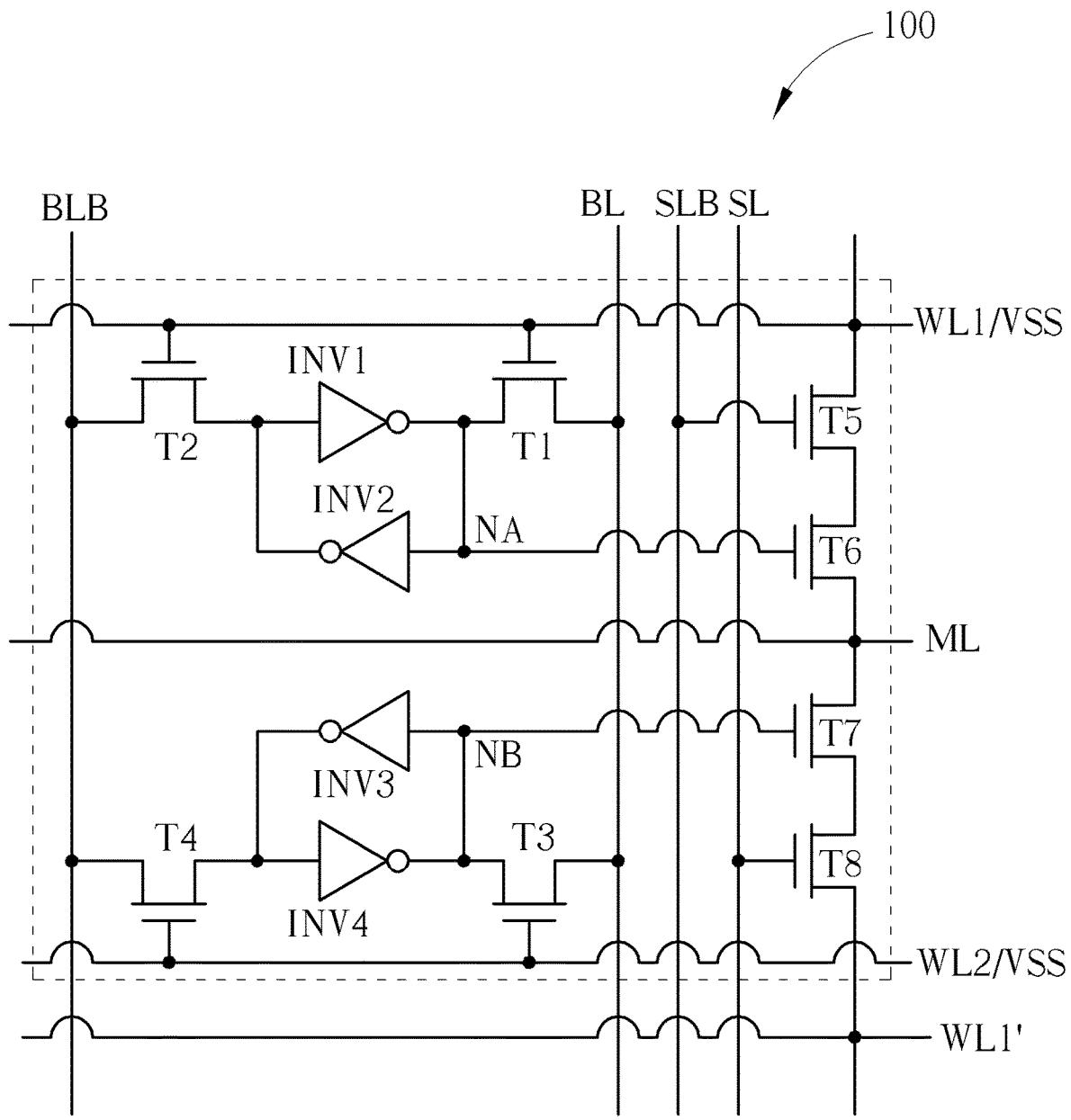
FIG. 1 is a diagram for a ternary content addressable memory (TCAM) unit of an embodiment.

FIG. 1 is a diagram for a ternary content addressable memory (TCAM) unit 100 in an embodiment of the present invention. The TCAM unit 100 includes a first inverter INV1, a second inverter INV2, a third inverter INV3, a fourth inverter INV4, a first transistor T1, a second transistor T2, a third transistor T3, a fourth transistor T4, and a fifth a transistor T5, a sixth transistor T6, a seventh transistor T7, and an eighth transistor T8. The first inverter INV includes an input terminal and an output terminal coupled to a first node NA. The second inverter INV2 includes an input terminal coupled to the first node NA and an output terminal coupled to the input terminal of the first inverter INV1. The third inverter INV3 includes an input terminal coupled to a second node NB and an output terminal. The fourth inverter INV4 includes an input terminal coupled to the output terminal of the third inverter INV3 and an output terminal coupled to the second node NB. The first transistor T1 includes a first terminal coupled to the first node NA, a second terminal coupled to a first bitline BL, and a control terminal coupled to a first wordline WL1. The second transistor T2 includes a first terminal coupled to a second bitline BLB, a second terminal coupled to the input terminal of the first inverter INV1 and a control terminal coupled to the first wordline WL1. The third transistor T3 includes a first terminal coupled to the second node NB, a second terminal coupled to the first bitline BL, and a control terminal coupled to a second wordline WL2. The fourth transistor T4 includes a first terminal coupled to the second bitline BLB, a second terminal coupled to the output terminal of the third inverter INV3 and a control terminal coupled to the second wordline WL2. The fifth transistor T5 includes a first terminal coupled to the first wordline WL1, a second terminal, and a control terminal coupled to a second searchline SLB. The sixth transistor T6 includes a first terminal coupled to the second terminal of the fifth transistor T5, a second terminal coupled to a matchline ML, and a control terminal coupled to the first node NA. The seventh transistor T7 includes a first terminal coupled to the matchline ML, a second terminal, and a control terminal coupled to the second node NB. The eighth transistor T8 includes a first terminal coupled to the second terminal of the seventh transistor T7, a second terminal coupled to another first wordline WL1', and a control terminal coupled to a first searchline SL. In the embodiment, the first wordline WL1 and/or the second wordline WL2 can be coupled to a reference terminal VSS. In another embodiment, the first wordline WL1 and/or the second wordline WL2 can be floating. The configuration is not limited by the embodiment.

The first inverter INV1, the second inverter INV2, the third inverter INV3, and the fourth inverter INV4 may be complementary MOSFET (CMOS) inverters. The first transistor T1 to the eighth transistors T8 may be N-type transistors. The first inverter INV1, the second inverter INV2, the first transistor T1 and the second transistor T2 may form a static random access memory (SRAM) unit. The third inverter INV3, the fourth inverter INV4, the third transistor T3, and the fourth transistor T4 may form another static random access memory (SRAM) unit.

TABLE 1

| Stored value | | Search value | | Match value |
|---|---|---|---|---|
| NA | NB | SL | SLB | ML |
| 0 | 0 | 1 | 0 | 1 (Match) |
| 0 | 0 | 1 | 1 | 0 (Mismatch) |
| 1 | 1 | 0 | 0 | 0 (Mismatch) |
| 1 | 1 | 0 | 1 | 0 (Mismatch) |
| 1 | 1 | 0 | 1 | 0 (Mismatch) |
| X (don't care) | 0 | 0 | 0/1 | 1/0 | 1 (Match) |
| Inhabit | 1 | 1 | — | — | — |

Table 1 describes the operation mode of the TCAM unit 100. According to Table 1, the TCAM unit 100 can include two bits, NA and NB, respectively. Since two bits can represent four possible states, but a TCAM requires only three states, this embodiment inhabits a states in which both NA and NB are 1. When the value of the first node NA is 0 and the value of the second node NB is 1, the stored value of the TCAM unit 100 is 0. If the search value is 0 (the first searchline SL signal is 0 and the second searchline SLB signal is 1), after evaluation the TCAM unit 100 outputs a match value of 1 through the matchline ML to represent a match. If the search value is 1 (the first searchline SL signal is 1 and the second searchline SLB signal is 0), after evaluation the TCAM unit 100 outputs a match value of 0 by the matchline ML to represent a mismatch. When the value of the first node NA is 1, and the value of the second node NB is 0, the stored value of the TCAM unit 100 is 1. If the search value is 0 (the first searchline SL signal is 0 and the second searchline SLB signal is 1), after evaluation, the TCAM unit 100 outputs a match value of 0 through the matchline ML to represent a mismatch. If the search value is 1 (the first searchline SL signal is 1 and the second searchline SLB signal is 0), after evaluation the TCAM unit 100 outputs a match value of 1 through the matchline ML to represent the match. When the value of the first node NA is 0 and the value of the second node NB is 0, the stored value of the TCAM unit 100 is X (don't care). For this condition, regardless of the search value, the TCAM unit 100 would output match value of 1 represents a match. When the stored value is X (don't care), the TCAM unit 100 performs a fuzzy lookup.

Figure 2:
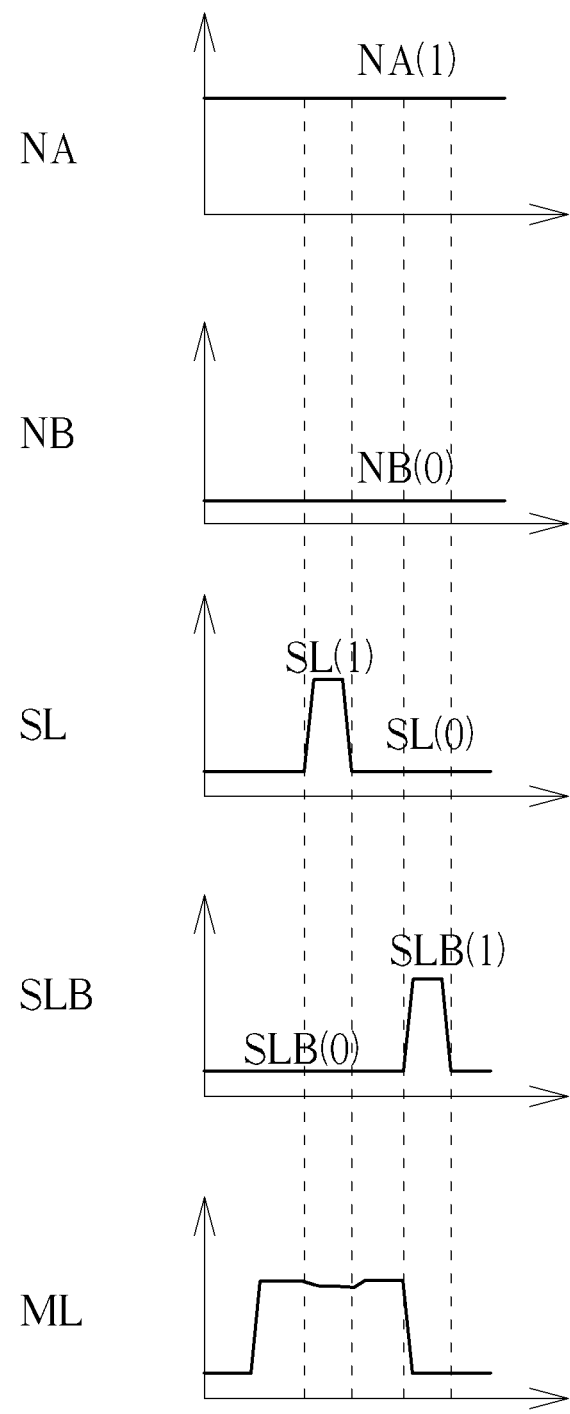
FIG. 2 is a search operation signal diagram of the TCAM unit in FIG. 1.

FIG. 2 is a search operation signal diagram of the TCAM unit in the embodiment of the present invention. The stored value of 1 is taken as an example, that is, the value of the first node NA is 1, and the value of the second node NB is 0. The matchline ML is precharged to high voltage, and the search value 1 is input to the TCAM unit 100 by setting the first searchline SL at high voltage and the second searchline SLB at low voltage. The transistor T5 and the transistor T7 are turned off and the transistor T6 and the transistor T8 are turned on. The connection of the matchline ML to the first wordline WL1 and the second wordline WL2 is interrupted, so that the voltage of the matchline ML is maintained at high voltage. Thus, the search result is determined to be a match by a detection circuit.

Again by taking the stored value 1 of the TCAM unit 100 as an example, the value of the first node NA is 1 and the value of the second node NB is 0. The matchline ML is precharged to high voltage, and the search value 0 is input to the TCAM unit 100 by setting the first searchline SL at low voltage and the second searchline SLB at high voltage. The transistor T5 and the transistor T6 are turned on, and the transistor T7 and the transistor T8 are turned off. The matchline ML would then be connected to the first wordline WL1 and the voltage of the matchline ML would drop to low voltage. Thus, the search result is determined to be a mismatch by the detection circuit.

Figure 3:
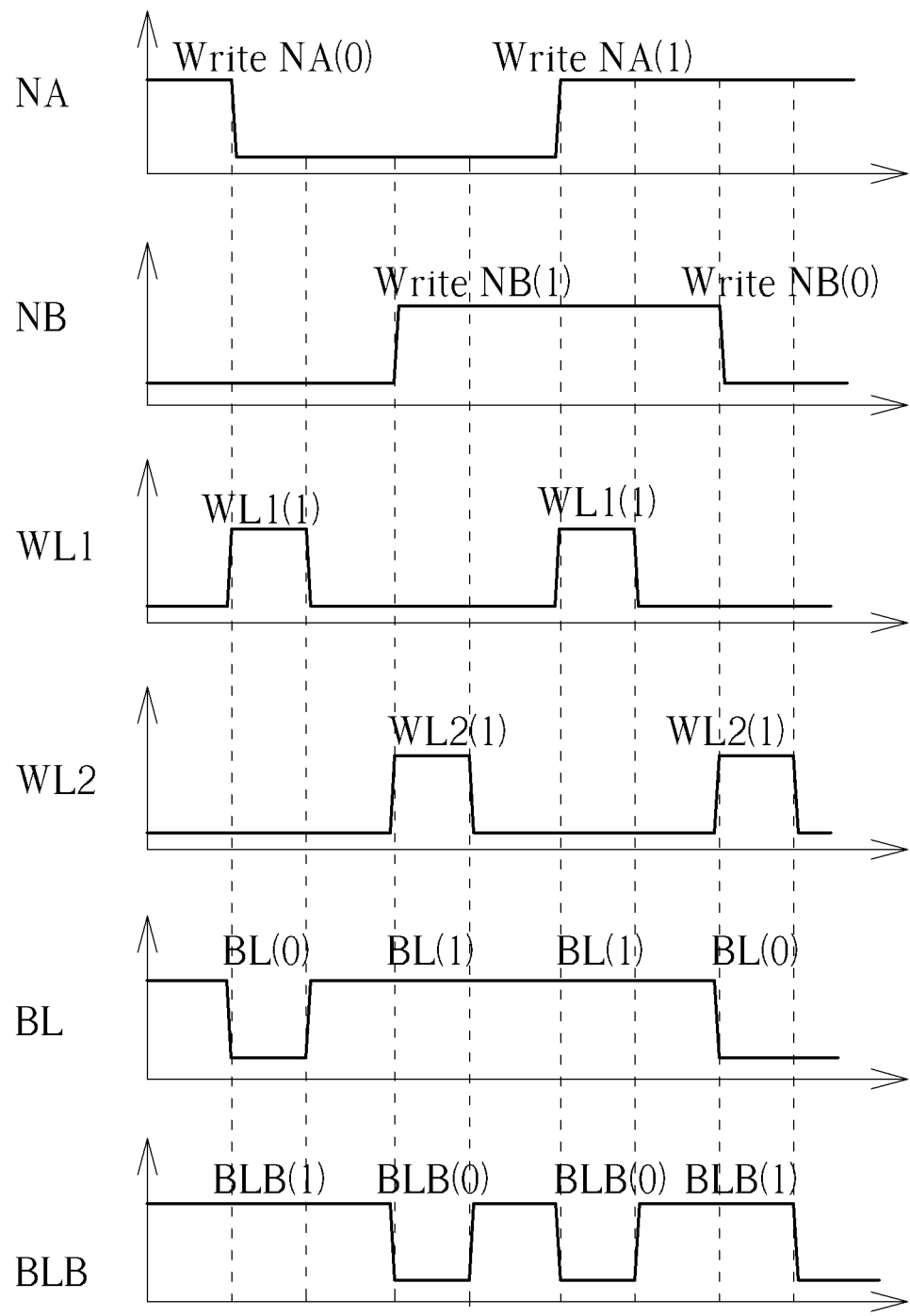
FIG. 3 is a diagram of write operation signals of the TCAM unit in FIG. 1.

FIG. 3 is a diagram of write operation signals of the TCAM unit 100 in the embodiment of the present invention. By writing the value of 0 to the TCAM unit 100, the first bitline BL is lowered to low voltage, and the second bitline BLB is at high voltage. The first wordline WL1 is at high voltage so that the transistor T1 and the transistor T2 are turned on. The value 0 represented by the low voltage on the first bitline BL is then written to the first node NA. In the subsequent period, the first wordline WL1 is pulled to low voltage, and the second wordline WL2 is pulled to high voltage so that the transistor T3 and the transistor T4 are turned on. The first bitline BL is pulled to high voltage, and the second bitline BLB is pulled to low voltage. The value 1 represented by the high voltage on the first bitline BL is then written to the second node NB, so that the stored value of the TCAM unit 100 is 0.

If the value 1 is to be written to the TCAM unit 100, the first bitline BL is pulled to high voltage, and the second bitline BLB is pull to low voltage. The first wordline WL1 is at high voltage so that the transistor T1 and the transistor T2 are turned on. The value 1 represented by the high voltage on the first bitline BL is then written to the first node NA. In the subsequent period, the first wordline WL1 is pulled to low voltage, and the second wordline WL2 is pulled to high voltage so that the transistor T3 and the transistor T4 are turned on. The first bitline BL is pulled to low voltage, and the second bitline BLB is pulled to high voltage. The value 0 represented by the low voltage on the first bitline BL is then written to the second node NB, so that the stored value of the TCAM unit 100 is 1.

Figure 4:
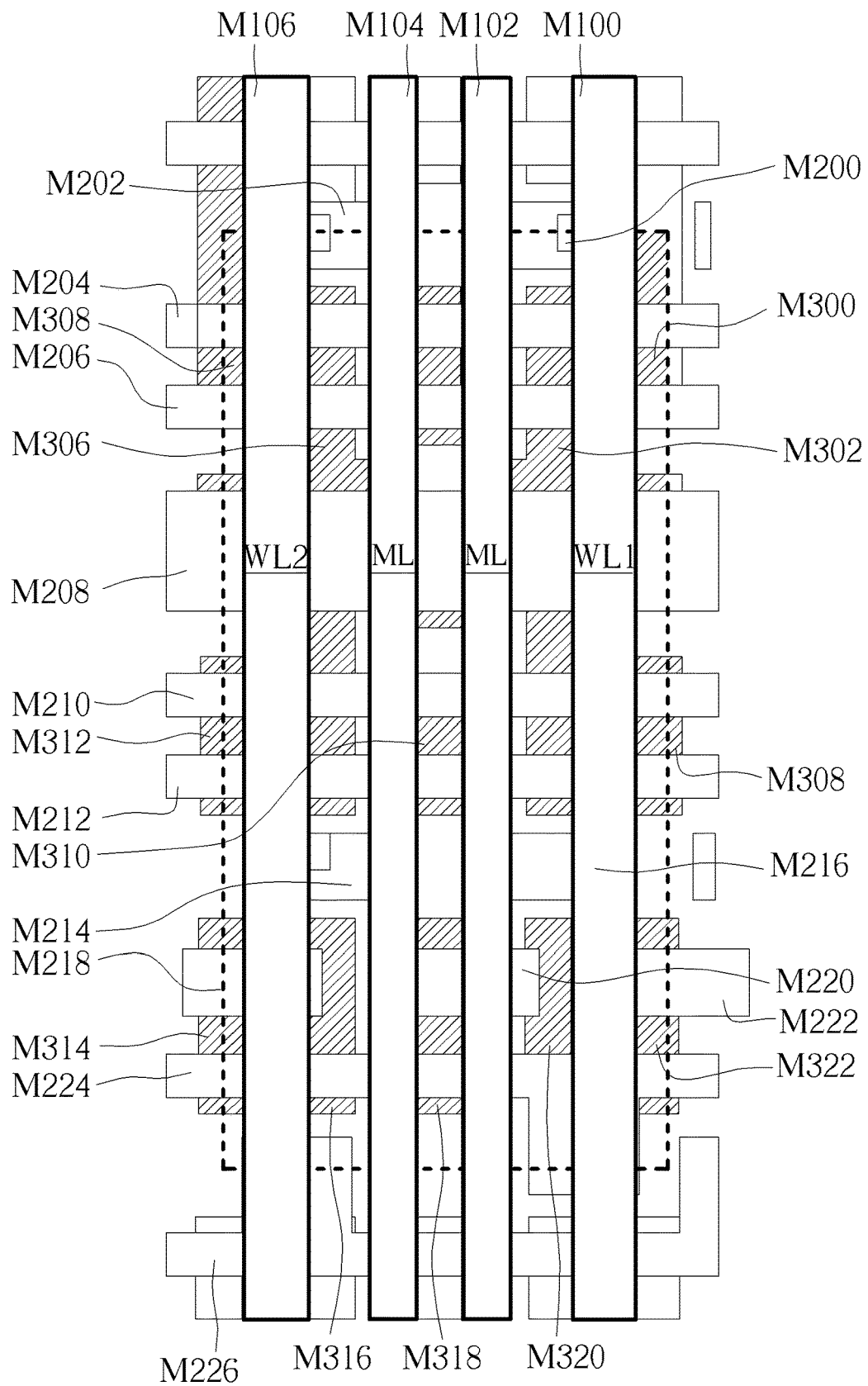
FIGS. 4 and 5 are diagrams of circuit layouts of the TCAM unit in FIG. 1.
Figure 5:
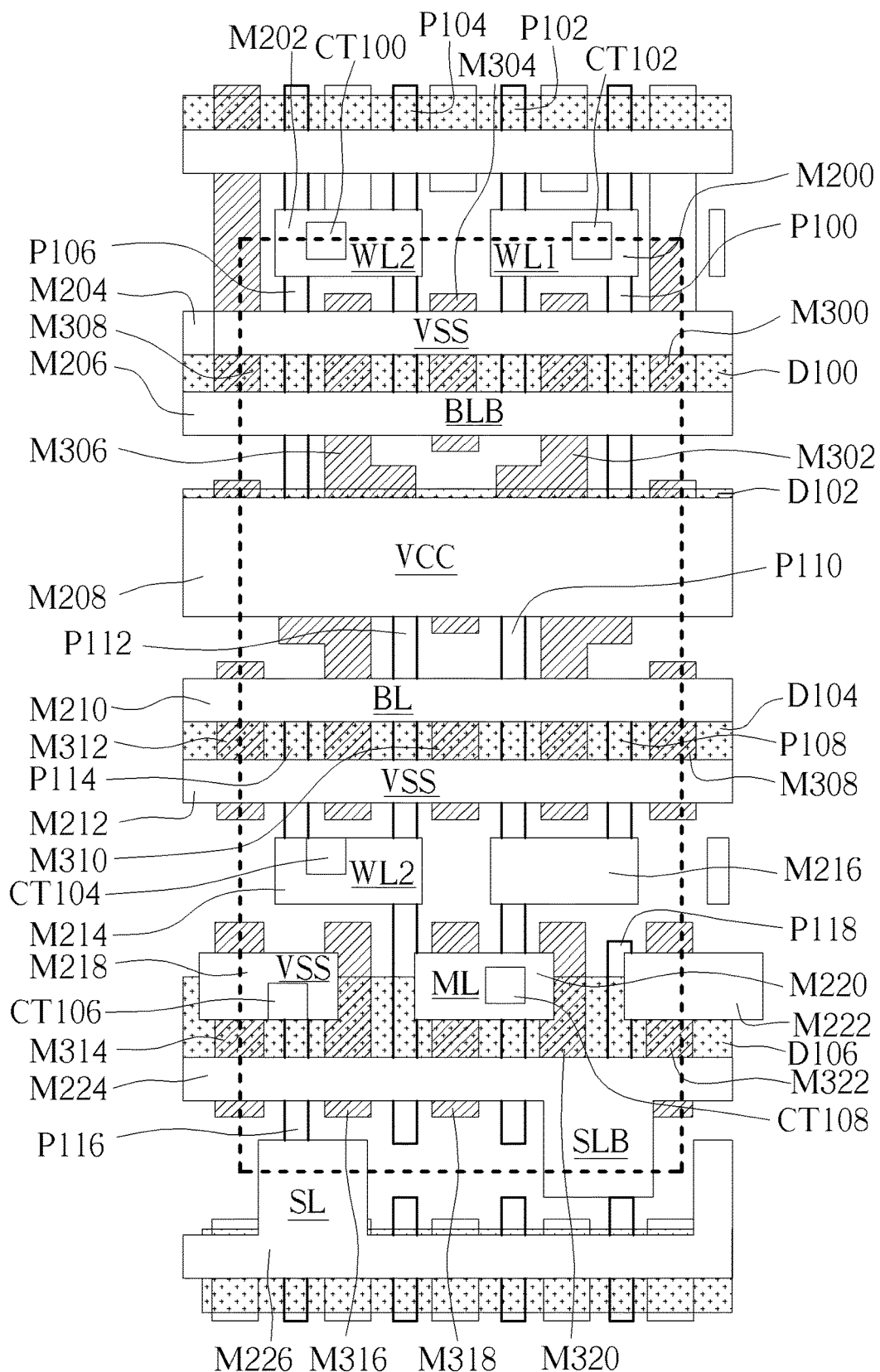

FIGS. 4 and 5 are circuit layouts of the TCAM unit of the embodiment. The first metal layers M100 to M106 are disposed at the top layer. The next layer is the second metal layers M200 to M226, and the next layer is the third metal layers M300 to M322 in contact with diffusion wells D100 to D106 and polysilicon P100 to P118.

The first metal layers M100 to M106 are in a vertical layout. The first metal layers M102 and M104 are the matchlines ML. The second metal layers M200 to M226 are in a horizontal layout perpendicular to the first metal layers M100 to M106. The second metal layers M200, M216 are coupled to the first metal layer M100 to form a first wordline WL1. The second metal layers M202, M214, M218 are coupled to the first metal layer M106 to form a second wordline WL2. The second metal layers M204, M212, M222 are the reference terminal VSS. The second metal layer M206 forms the second bitline BLB. The second metal layer M208 forms the system voltage terminal VCC. The second metal layer M210 forms the first bitline BL. The second metal layer M220 is coupled to the first metal layer M102 to form the matchline ML. The second metal layer M224 forms the second searchline SLB, and the second metal layer M226 forms the first searchline SL. The third metal layers M300 to M322 are metal semiconductor junction in contact with the polysilicon P100 to P118. Metal contacts CT100 to CT108 are used to couple the first metal layer and the second metal layer. The polysilicon P100 to P118 forms the gates of the transistors in the embodiment, and the diffusion wells D100 to D106 form the source and the drain of the transistors in the embodiment.

In summary, the embodiment of the present invention provide a ternary content addressable memory that can solve the problem of charge sharing between the nodes, thereby solving match error caused by charge sharing. The circuit layout of the embodiment can also effectively reduce the metal layer required for manufacturing, thereby achieving the purpose of simplifying design and reducing cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A ternary content addressable memory (TCAM) unit comprising:
   a first inverter comprising:
      an input terminal; and
      an output terminal coupled to a first node;
   a second inverter comprising:
      an input terminal coupled to the first node; and
      an output terminal coupled to the input terminal of the first inverter;
   a third inverter comprising:
      an input terminal coupled to a second node; and
      an output terminal;
   a fourth inverter comprising:
      an input terminal coupled to the output terminal of the third inverter; and
      an output terminal coupled to the second node;
   a first transistor comprising:
      a first terminal coupled to the first node;
      a second terminal coupled to a first bitline; and
      a control terminal coupled to a first wordline;
   a second transistor comprising:
      a first terminal coupled to a second bitline;
      a second terminal coupled to the input terminal of the first inverter; and
      a control terminal coupled to the first wordline;
   a third transistor comprising:
      a first terminal coupled to the second node;
      a second terminal coupled to the first bitline; and
      a control terminal coupled to a second wordline;
   a fourth transistor comprising:
      a first terminal coupled to the second bitline;
      a second terminal coupled to the output terminal of the third inverter; and
      a control terminal coupled to the second wordline;
   a fifth transistor comprising:
      a first terminal coupled to the first wordline;
      a second terminal; and
      a control terminal coupled to a second searchline;
   a sixth transistor comprising:
      a first terminal coupled to the second terminal of the fifth transistor;
      a second terminal coupled to a matchline; and
      a control terminal coupled to the first node;
   a seventh transistor comprising:
      a first terminal coupled to the matchline;
      a second terminal; and
      a control terminal coupled to the second node; and
   an eighth transistor comprising:
      a first terminal coupled to the second terminal of the seventh transistor;
      a second terminal coupled to another first wordline; and
      a control terminal coupled to a first searchline;
   wherein the first wordline and/or the second wordline is grounded; and the first wordline, the second wordline, and the matchline form a first metal layer of the TCAM unit.

2. The TCAM unit of claim 1, wherein the first searchline, the second searchline, the first bitline and the second bitline form a second metal layer of the TCAM unit.

3. The TCAM unit of claim 2, wherein the first wordline, the second wordline and the matchline are perpendicular to the first searchline, the second searchline, the first bitline, and the second bitline.

4. The TCAM unit of claim 1, wherein the first inverter, the second inverter, the third inverter, and the fourth inverter are complementary MOSFET (CMOS) inverters.

5. The TCAM unit of claim 1, wherein the first transistor to the eighth transistor are N-type transistors.

6. The TCAM unit of claim 5, wherein the first inverter, the second inverter, the first transistor and the second transistor form a static random access memory (SRAM) unit.

7. The TCAM unit of claim 5, wherein the third inverter, the fourth inverter, the third transistor and the fourth transistor form a static random access memory (SRAM) unit.

8. The TCAM unit of claim 1, wherein the first bitline and the second bitline are complementary to one another, and the first searchline and the second searchline are complementary to one another.

9. A ternary content addressable memory (TCAM) unit comprising:
a first inverter comprising:
an input terminal; and
an output terminal coupled to a first node;
a second inverter comprising:
an input terminal coupled to the first node; and
an output terminal coupled to the input terminal of the first inverter;
a third inverter comprising:
an input terminal coupled to a second node; and
an output terminal;
a fourth inverter comprising:
an input terminal coupled to the output terminal of the third inverter; and
an output terminal coupled to the second node;
a first transistor comprising:
a first terminal coupled to the first node;
a second terminal coupled to a first bitline; and
a control terminal coupled to a first wordline;
a second transistor comprising:
a first terminal coupled to a second bitline;
a second terminal coupled to the input terminal of the first inverter; and
a control terminal coupled to the first wordline;
a third transistor comprising:
a first terminal coupled to the second node;
a second terminal coupled to the first bitline; and
a control terminal coupled to a second wordline;
a fourth transistor comprising:
a first terminal coupled to the second bitline;
a second terminal coupled to the output terminal of the third inverter; and
a control terminal coupled to the second wordline;
a fifth transistor comprising:
a first terminal coupled to the first wordline;
a second terminal; and
a control terminal coupled to a second searchline;
a sixth transistor comprising:
a first terminal coupled to the second terminal of the fifth transistor;
a second terminal coupled to a matchline; and
a control terminal coupled to the first node;
a seventh transistor comprising:
a first terminal coupled to the matchline;
a second terminal; and
a control terminal coupled to the second node; and
an eighth transistor comprising:
a first terminal coupled to the second terminal of the seventh transistor;
a second terminal coupled to another first wordline; and
a control terminal coupled to a first searchline;
wherein the first wordline and/or the second wordline is floating; and
the first wordline, the second wordline, and the matchline form a first metal layer of the TCAM unit.

10. The TCAM unit of claim 9, wherein the first searchline, the second searchline, the first bitline and the second bitline form a second metal layer of the TCAM unit.

11. The TCAM unit of claim 10, wherein the first wordline, the second wordline and the matchline are perpendicular to the first searchline, the second searchline, the first bitline, and the second bitline.

12. The TCAM unit of claim 9, wherein the first inverter, the second inverter, the third inverter, and the fourth inverter are complementary MOSFET (CMOS) inverters.

13. The TCAM unit of claim 9, wherein the first transistor to the eighth transistor are N-type transistors.

14. The TCAM unit of claim 13, wherein the first inverter, the second inverter, the first transistor and the second transistor form a static random access memory (SRAM) unit.

15. The TCAM unit of claim 13, wherein the third inverter, the fourth inverter, the third transistor and the fourth transistor form a static random access memory (SRAM) unit.

16. The TCAM unit of claim 9, wherein the first bitline and the second bitline are complementary to one another, and the first searchline and the second searchline are complementary to one another.

* * * * *